(12) United States Patent
Wert

(10) Patent No.: US 6,194,944 B1
(45) Date of Patent: Feb. 27, 2001

(54) INPUT STRUCTURE FOR I/O DEVICE

(75) Inventor: Joseph Douglas Wert, Arlington, TX (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/302,634

(22) Filed: Apr. 29, 1999

(51) Int. Cl.[7] ........................................... H03K 5/08
(52) U.S. Cl. ................... 327/327; 327/328; 327/333
(58) Field of Search ................................. 327/313, 327, 327/328, 333, 407, 408, 544, 545, 546; 361/91; 365/226, 227

(56) References Cited

U.S. PATENT DOCUMENTS

| | | | |
|---|---|---|---|
| 5,184,031 | * 2/1993 | Hayakawa et al. | 327/296.3 |
| 5,457,421 | * 10/1995 | Tanabe | 327/539 |
| 5,812,017 | * 9/1998 | Golla et al. | 327/536 |
| 5,886,561 | * 3/1999 | Eitan et al. | 327/408 |
| 5,914,626 | * 6/1999 | Kim et al. | 327/309 |

* cited by examiner

*Primary Examiner*—Kenneth B. Wells
*Assistant Examiner*—Paul Dinh
(74) *Attorney, Agent, or Firm*—Skjerven Morrill MacPherson; Edward C. Kwok

(57) ABSTRACT

An input structure protects an Integrated Circuit (IC) against increases in the IC pad voltage when the supply voltage to the IC is tuned off. The input structure includes circuitry for transferring either a divided-down pad voltage or the positive supply voltage to a buffer circuitry. The buffer circuitry receives the voltage transferred thereto and lowers the pad voltage. The lowered pad voltage generated by the buffer circuitry is subsequently applied to the IC.

9 Claims, 7 Drawing Sheets

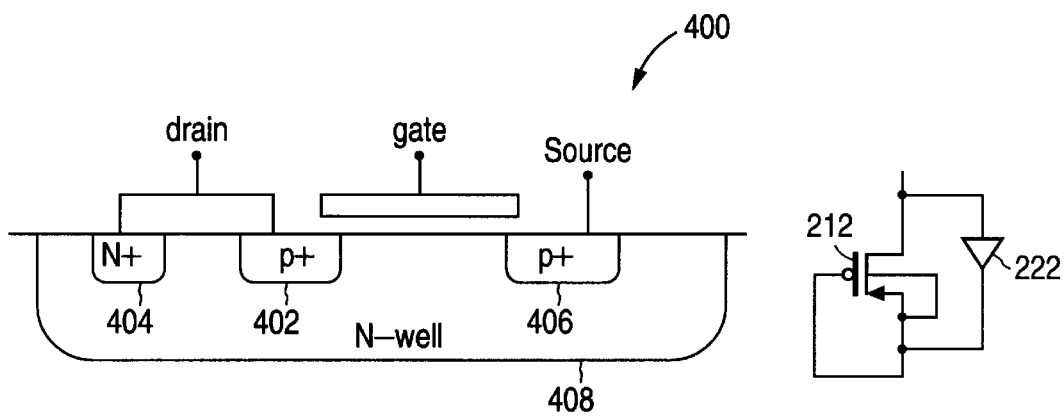
Fig. 5A  Fig. 5B
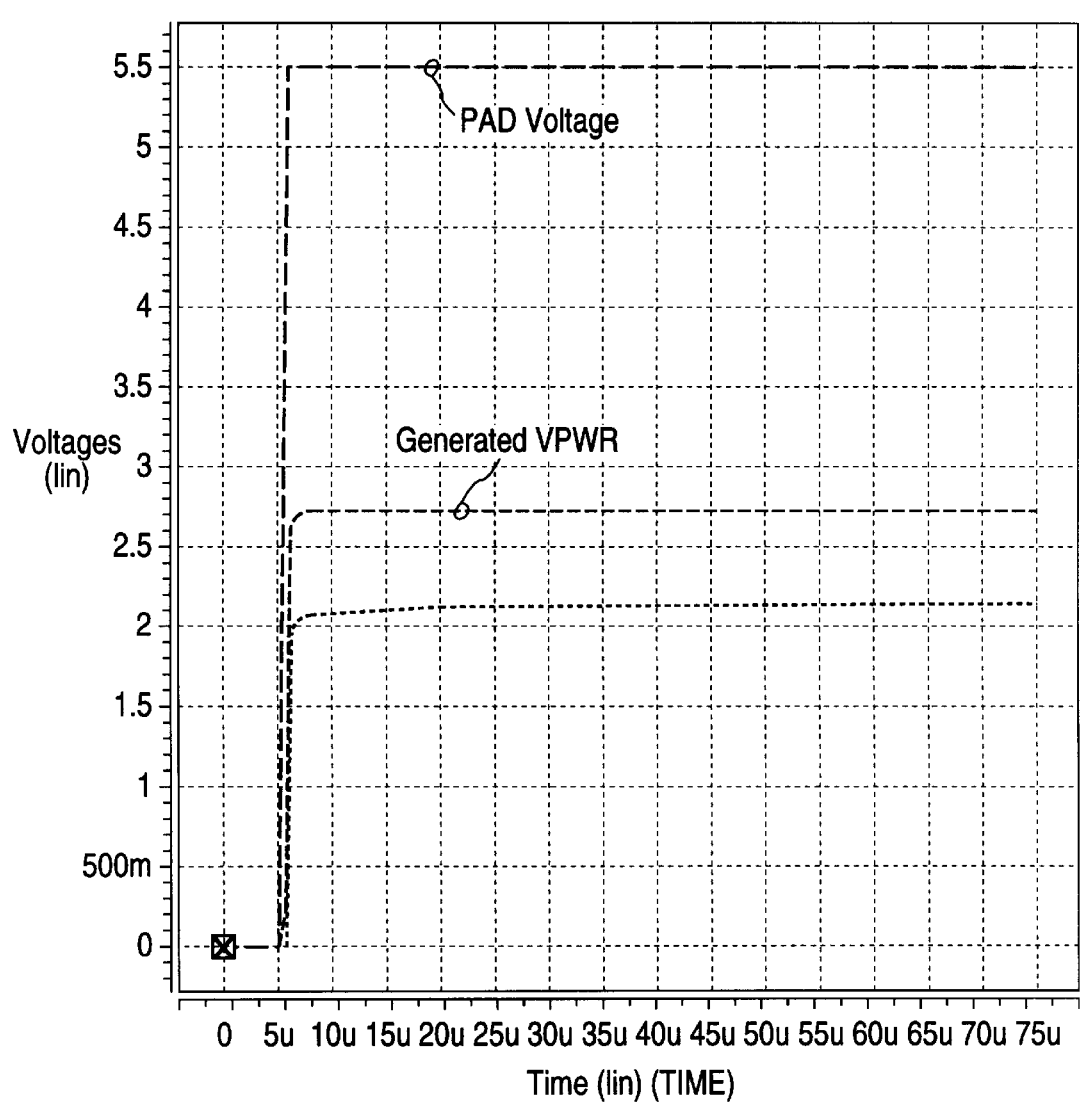
Fig. 6

US 6,194,944 B1

INPUT STRUCTURE FOR I/O DEVICE

FILED OF THE INVENTION

The present invention relates to input structures and, more particularly, to input structures for protecting Integrated Circuits.

BACKGROUND OF THE INVENTION

Input structures for protecting the gate oxide of MOS (Metal Oxide Semiconductor) transistors connected to input pads are widely used in Integrated Circuits (IC). Such an input structure typically receives the voltage applied to an IC pad and supplies a reduced voltage to the IC thereby ensuring that the gate-to-source and gate-to-drain voltages of the IC transistors do not exceed a maximum allowable limit.

Currently known input structures fail to provide adequate protection for the gate oxide when no power is supplied to the IC and yet the pads of the IC continue to receive power. The problem is further compounded when ICs manufactured using deep submicron (e.g. 0.25 $\mu$m) CMOS technologies—where the gate-to-source and gate-to-drain voltages of an MOS transistor must remain below 3.5 volts—are used in a system requiring 5.5 volts to operate. When used in such a system, the IC must be able to withstand the application of 5.5 volts to its pads both when the power supply to the IC is on and when it is off.

FIG. 1 shows a known input structure 10. Input structure 10 receives voltage Vin on pad 12 and supplies voltage Vout at the output terminal of inverter 22. Input structure 10 suffers from contention, as described below. To force the voltage Vout to a low level when no voltage is applied to pad 12, a user may place an external resistor (not shown) across pad 12 and the system ground. When such a resistor is used and a hiqh voltage is applied to pad 12 before tri-stating pad 12, PMOS transistor 18 turns on, pulling node N1 to a high voltage. At the same time, the external resistor pulls node N1 to ground. Therefore, a contention develops between PMOS transistor 18 and the external transistor. If the pull-up capability of transistor 18 is greater than the pull-down capability of the external resistor, voltage Vout remains at the high level.

FIG. 2 shows known input structure 30. Input structure 30 does not have the contention problem of input structure 10 but consumes too much DC power because PMOS transistor 36 is never completely turned off.

FIG. 3 shows known input structure 50. Input structure 50 does not have the contention problem of input structure 10 nor does it have the excessive power consumption of input structure 30 but it suffers from a major disadvantage. To avoid the natural hysterisis in input structure 50, PMOS transistors 56 and 58 must be made large to meet the required threshold high and low specifications and which, in turn, makes the input structure undesirably slow.

In yet other known input structures (not shown) the MOS transistors are formed using thick gate oxides to protect against the pad over-voltage when the supply voltage is tuned off. Therefore, an IC containing such an input structure requires a manufacturing process that supports both regular and thick gate oxide MOS transistors and is thus expensive.

Therefor, a need exists for an input structure for protecting the internal circuitry of an IC when the pads of the IC continue to receive power but the supply power to the IC is turned off, and which overcomes the known problems of the existing input structures discussed above.

SUMMARY OF THE INVENTION

An input structure for an Integrated Circuit (IC), in accordance with one embodiment of the present invention, includes a first group of transistors for dividing the IC pad voltage, a second group of transistors for transferring the IC supply voltage, and a transistor for coupling the first and the second groups of transistors.

The input structure further includes a buffer circuit which receives either the divided pad voltage or the transferred supply voltage and generates a voltage that is applied to the IC.

When the supply voltage to the IC is turned off, the first group of transistors divides the pad voltage and supplies it to the buffer circuit. During this time, the coupling transistor remains conducting to disable the second group of transistors. When the supply voltage to the IC is turned on, some of the transistors in the first group and the coupling transistor are turned off. Transistors in the second group transfer the supply voltage to the buffer circuit.

The buffer circuit includes a first inverter coupled to additional transistors to ensure that the gate-to-source and gate-to-drain voltage of the inverter transistors do not exceed a specified limit. A second inverter of the buffer receives the output voltage of the first buffer and supplies the voltage to the IC.

BRIEF DESCRIPTION OF THE DRAWINGS

FIG. 5A shows a cross-sectional view of one of the transistors of FIG. 4.

FIG. 5B shows a schematic view of the transistor of FIG. 5A.

FIG. 6 shows the computer simulation results of the voltage level at one of the nodes of the input structure of FIG. 4.

DETAILED DESCRIPTION

Figure 1:
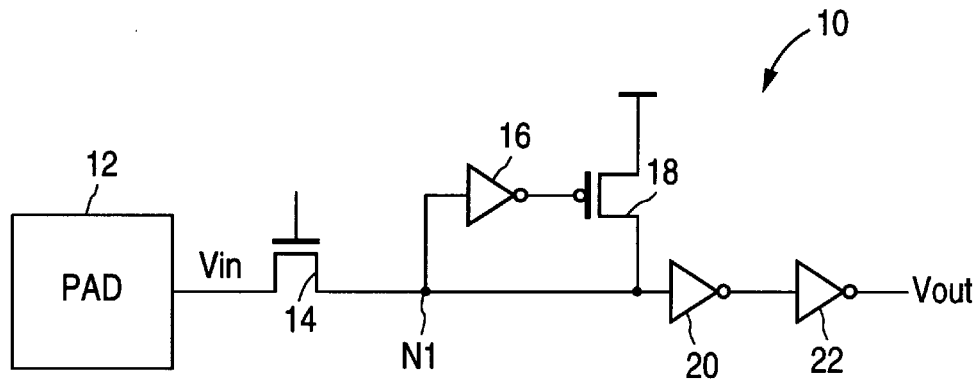
FIG. 1 is a schematic diagram of a known input structure.
Figure 2:
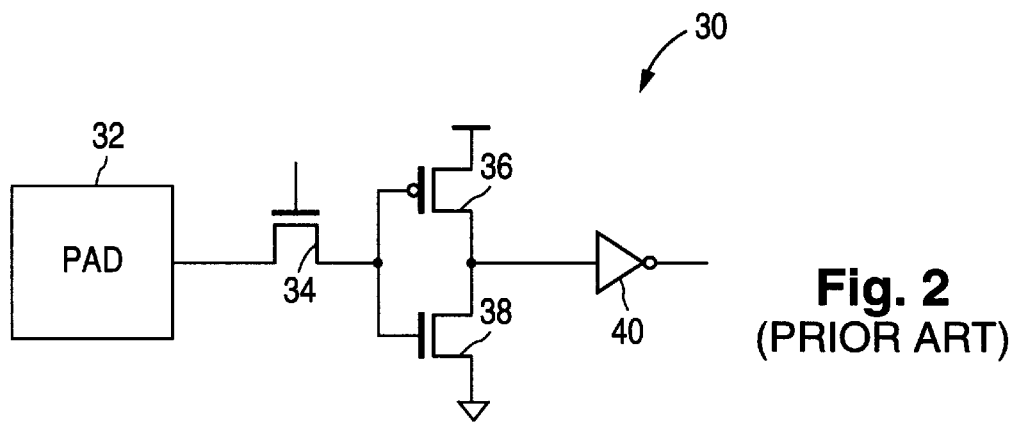
FIG. 2 is a schematic diagram of another known input structure.
Figure 3:
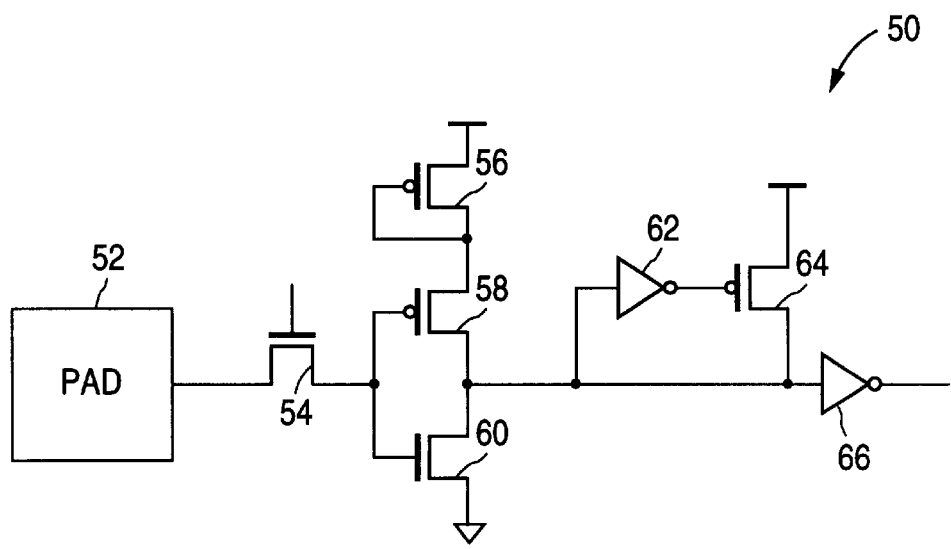
FIG. 3 is a schematic diagram of another known input structure.
Figure 4:
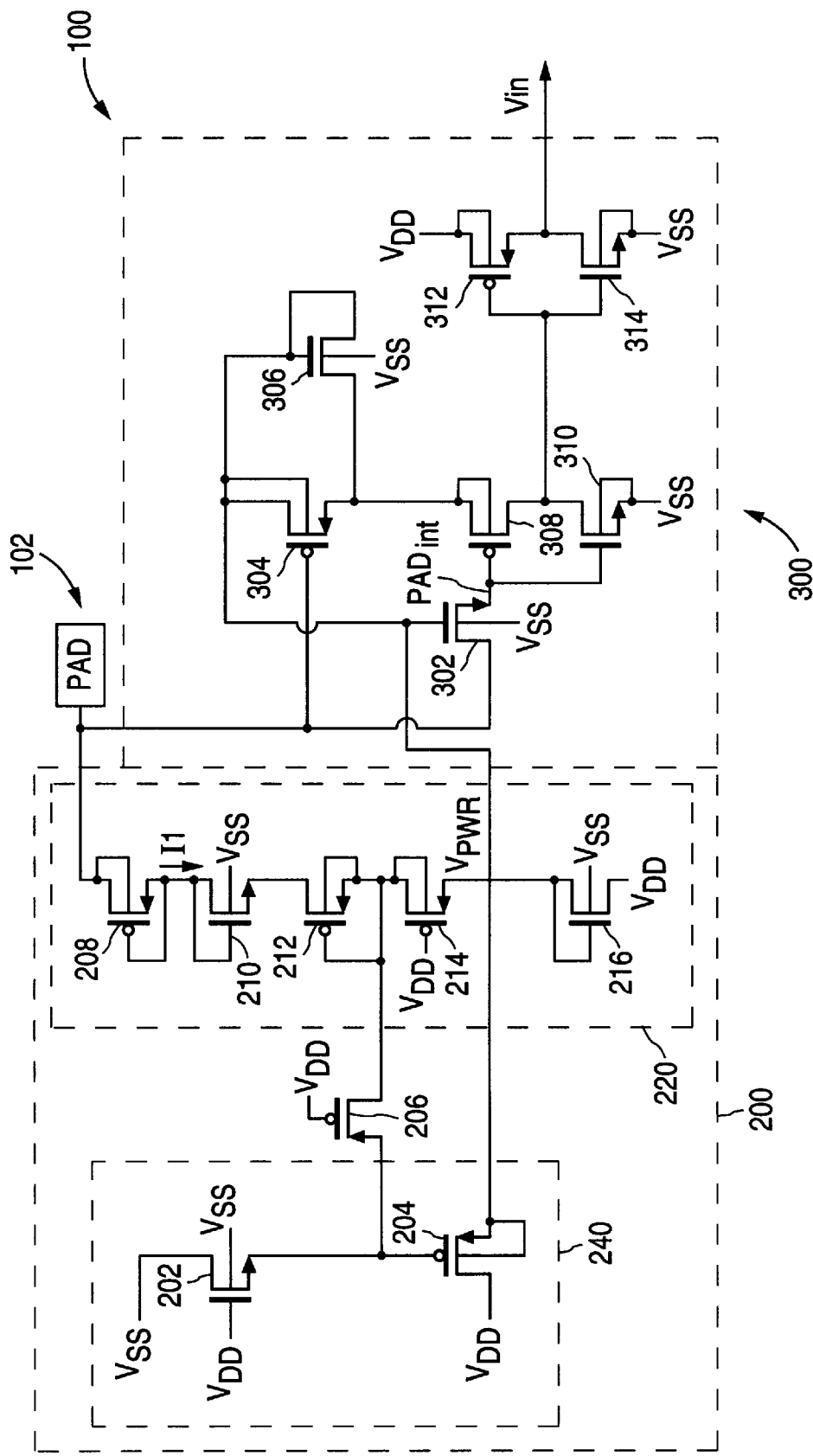
FIG. 4 shows a schematic diagram of the input structure, in accordance with one embodiment of the present invention.

A transistor schematic diagram of input structure 100 of an Integrated Circuit (IC), in accordance with one embodiment of the present invention, is depicted in FIG. 4. Input structure 100 includes circuit 200 for generating voltage signal Vpwr which is equal to either the positive supply voltage Vdd or to a divided-down voltage of pad 102. Input structure 100 also includes circuit 300 for generating voltage signal Vin which is applied to the IC.

Circuit 200 includes transistor groups 220, 240 and coupling transistor 206. Transistor group 220, in turn, includes PMOS transistors 208, 212 and 214 and NMOS transistors 210 and 216. Transistor group 240 includes NMOS transistors 202 and PMOS transistor 204. The operation of circuit 200 when voltage supply Vdd is turned off (i.e. Vdd is at 0 volts) is described next.

When Vdd is at 0 volts and a high voltage (e.g. 5.5 volts) is applied to pad 102, a current discharge path forms between pad 102 and supply voltage Vdd through transistors 208, 210, 212, 214 and 216. The source and bulk terminals of PMOS transistor 208 are connected to pad 102 and the gate and the drain terminals of PMOS transistor 208 are connected to the drain terminal of transistor 210. Therefore, PMOS transistor 208 turns on and provides slightly less than one PMOS threshold voltage across its drain-to-source terminals. In other words, PMOS transistor 208 operates in a subthreshold region.

NMOS transistor 210 has its gate and drain terminals connected together. The source terminal of NMOS transistor 210 is connected to the source terminal of PMOS transistor 212 and the substrate terminal of NMOS transistor 210 is connected to the voltage supply Vss. NMOS transistor 210 also operates in a subthreshold region and thus provide slightly less than one NMOS threshold voltage drop across its drain-to source terminals.

The gate, drain and bulk terminals of NMOS transistor 212 are connected together. FIG. 5A shows a cross-sectional view 400 of PMOS transistor 212. As seen from FIG. 5A, the drain region 402 of transistor 212 is connected to N$^+$ region 404. Source region is separated from drain region 402 by a P-N junction diode formed between source 402 and N-well 408. In other words, a p-n junction diode 222 exists in parallel between the source and drain terminals of PMOS transistor 212, as shown in FIG. 5B. Consequently, the voltage drop across the drain-to-source terminals of transistor 212 is equal to one base-to-emitter voltage (i.e., Vbe) of a bipolar transistor. Because the threshold voltage of an MOS transistor has a positive temperature coefficient (i.e. the threshold voltage increases with rising temperature) and the base-to-emitter voltage of a bipolar transistor has a negative temperature coefficient (i.e. the base-to-emitter voltage decreases with rising temperature), the voltage at the drain terminal of PMOS transistor 212 exhibits a reduced sensitivity to temperature variations.

The combined transistors 208, 210 and 212 provide a voltage at the drain terminal of transistor 212 that is lower than that of pad 102 by a sum consisting of slightly less than one NMOS threshold voltage (because transistor 212 operates just below the threshold region), slightly less than one PMOS threshold voltage (because transistor 214 operates just below the threshold region), and a bipolar base-to-emitter voltage.

PMOS transistor 206 has a source terminal that is coupled to the gate terminal of PMOS transistor 212 and a gate terminal that is coupled to supply voltage Vdd. The drain terminal of transistor 206 is connected to the gate terminal of PMOS transistor 204 and to the drain terminal of NMOS transistor 202. When the supply voltage Vdd is at zero volts and the voltage applied to pad 102 is greater than four MOS transistor threshold voltages and a bipolar transistor base-to-emitter voltage, the voltage passed from the source terminal to the drain terminal of PMOS transistor 206 switches off transistor 204 whose source terminal receives supply voltage Vdd. The gate and drain terminals of NMOS transistor 202 respectively receive Vdd and Vss supply voltages. Therefore, NMOS transistor 202 remains off when supply voltage Vdd is at 0 volts.

Because the gate terminal of PMOS transistor 214 receives supply voltage Vdd, when the supply voltage Vdd is at zero volts, the voltage at the source terminal of PMOS transistor 214 is passed to its drain terminal which generates voltage signal Vpwr. The source terminal of PMOS transistor 214 is connected to the drain terminal of NMOS transistor 212 while the drain terminal of PMOS transistor 214 is connected to the drain terminals of PMOS transistors 204 and NMOS transistor 216.

The gate and drain terminals of NMOS transistor 216 are connected together and the source terminal of NMOS transistor 216 receives supply voltage Vdd. Therefore, transistor 216 stays conductive when voltage Vdd is at 0 volts.

Consequently, when Vdd is at 0 volts and a high voltage is applied to pad 102, each of transistors 208, 210, 212, 214 and 216 conducts current I1 which flows from pad 102 to voltage supply Vdd. The magnitude of current I1 is such that PMOS transistor 208 and NMOS transistor 210 operate in their respective subthreshold region. The operation of circuit 200 when voltage supply Vdd is turned on is described next.

When supply voltage Vdd is turned on, NMOS transistor 202 turns on. Consequently, voltage Vss is applied to the gate terminal of PMOS transistor 204, turning on PMOS transistor 204. Therefore, signal voltage Vpwr receives the full Vdd supply voltage. Also, when supply voltage Vdd is turned on, PMOS transistor 214 and NMOS transistor 216 are both in a non-conducting state and, therefore, the voltage signal Vpwr is unaffected by the transistors in the transistor group 220. Consequently, when voltage supply Vdd is switched on, the current discharge path from pad 102 to voltage supply Vdd is shut off. Voltage signal Vpwr is applied to circuit 300, which is described next.

Circuit 300 includes NMOS transistors 302, 306, 310, 314 and PMOS transistors 304, 308 and 312. Circuit 300 acts as a buffer transferring a level-shifted voltage of pad 102 to the IC.

As stated above, to operate reliably, the gate-to-source and gate-to-drain voltages of all transistors in input structure 100 must be smaller than a maximum allowable limit (e.g. 3.4 volts). Supply voltage Vdd is never increased above the maximum allowable limit. Therefore, when the voltage applied to pad 102 is 0, the gate-to-source and gate-to-drain voltages of all the transistors in input structure 100 stay within the allowable limit. Application of voltage signal Vpwr to circuit 300 ensures that the maximum allowable gate-to-source and gate-to-drain voltages are not exceeded when a high voltage is applied to pad 102.

Voltage signal Vpwr is applied to the source and substrate terminals of transistor 304 whose gate terminal is connected to pad 102. Therefore, the voltage across the gate-to-source region of transistor 304 is always maintained below the maximum allowable limit. To ensure that the voltage across the gate-to-drain regions of transistor 304 stays below the allowable limit, the drain terminal of transistor 304 is connected to the source terminal of transistor 306 whose gate and drain terminals are supplied with voltage signal Vpwr. Because no DC current flows through transistor 306, transistor 306 operates in a subthreshold region and, therefore, the voltage across the drain and source regions of transistor 306 is smaller than an NMOS transistor threshold voltage. Consequently, even when a high voltage (e.g. 5.5 volts) is applied to pad 102, the voltages across the gate-to-source and gate-to-drain regions of transistor 304 stay within the allowable limit.

The drain terminal of transistor 302 is connected to pad 102. Voltage signal Vpwr is applied to the gate terminal of transistor 302. Therefore, the voltage signal PADint of the source terminal of transistor 302 is at a transistor threshold voltage below that of its drain terminal. The source terminal of transistor 302 is connected to the gate terminals of transistors 308 and 310 which together form an inverter.

The voltage of the source terminal of transistor 308 (i.e. the drain terminal of transistor 310) is applied to the gate terminals of transistors 312 and 314. The source terminals of transistors 312 and 314 are respectively connected to supply voltages Vdd and Vss. The drain terminals of transistors 312 and 314 are connected together and provide voltage signal Vin which is applied to the IC.

When the voltage at pad 102 is at a low level (i.e. at Vss), and voltage supply Vdd is turned on, voltage signal Vin is also at the Vss voltage level. Similarly, when the voltage at pad 102 is at a high level (i.e. 5.5 volts), and voltage supply Vdd is turned on, voltage signal Vin is at the Vdd voltage level. Thus, when the voltage at pad 102 is at a high level and supply voltage Vdd is turned off, voltage signal Vin is also at the Vss voltage level, but all the transistors in input structure 100 experience allowable gate-to-source and gate-to-drain voltages.

In one embodiment of the present invention, the CMOS process used to manufacture input structure 100 requires that the gate-to-source and gate-to-drain voltages not to exceed 4.3 volts. Accordingly, the transistor sizes of circuit 200 and circuit 300 are as follows:

| transistor no. | channel width ($\mu$m) | channel length ($\mu$m) |
|---|---|---|
| 202 | 8 | 2 |
| 204 | 35 | 1 |
| 206 | 3 | 1 |
| 208 | 8 | 1 |
| 210 | 8 | 1 |
| 212 | 8 | 1 |
| 214 | 8 | 1 |
| 216 | 1 | 35 |
| 302 | 15 | 1 |
| 304 | 18 | 1 |
| 306 | 1 | 4 |
| 308 | 18 | 1 |
| 310 | 3 | 1 |
| 312 | 14 | 1 |
| 314 | 6 | 1 |

In the above embodiment, supply voltage Vdd may vary between 3.0 to 3.6 volts and the pad 102 voltage may vary between 0 and 5.5 volts.

Transistor 216 whose channel width and channel length are 1 $\mu$m and 25 $\mu$m respectively operates in a linear mode and accordingly acts as a resistor. By selecting in transistor 216 the above channel dimensions, the bias current through transistors 208, 210, 212 and 214 is set. The voltage drop across each of transistors 208, 210, 212 and 214 is determined by, in part, by their respective channel dimensions as well as by the current flow through them.

FIG. 6 shows the computer simulation results of the generated voltage signal Vpwr of input structure 100 when pad 102 is at 5.5 volts and supply voltage Vdd is at 0 volts, using the transistor sizes as shown in the above table. As seen from FIG. 6, voltage signal Vpwr is at 2.7 volts when Vdd is at 0 volts. Voltage signal Vpwr and supply voltage Vdd are at the same potential when supply voltage Vdd is between 1.6 and 2.7 volts (not shown).

Figure 7:
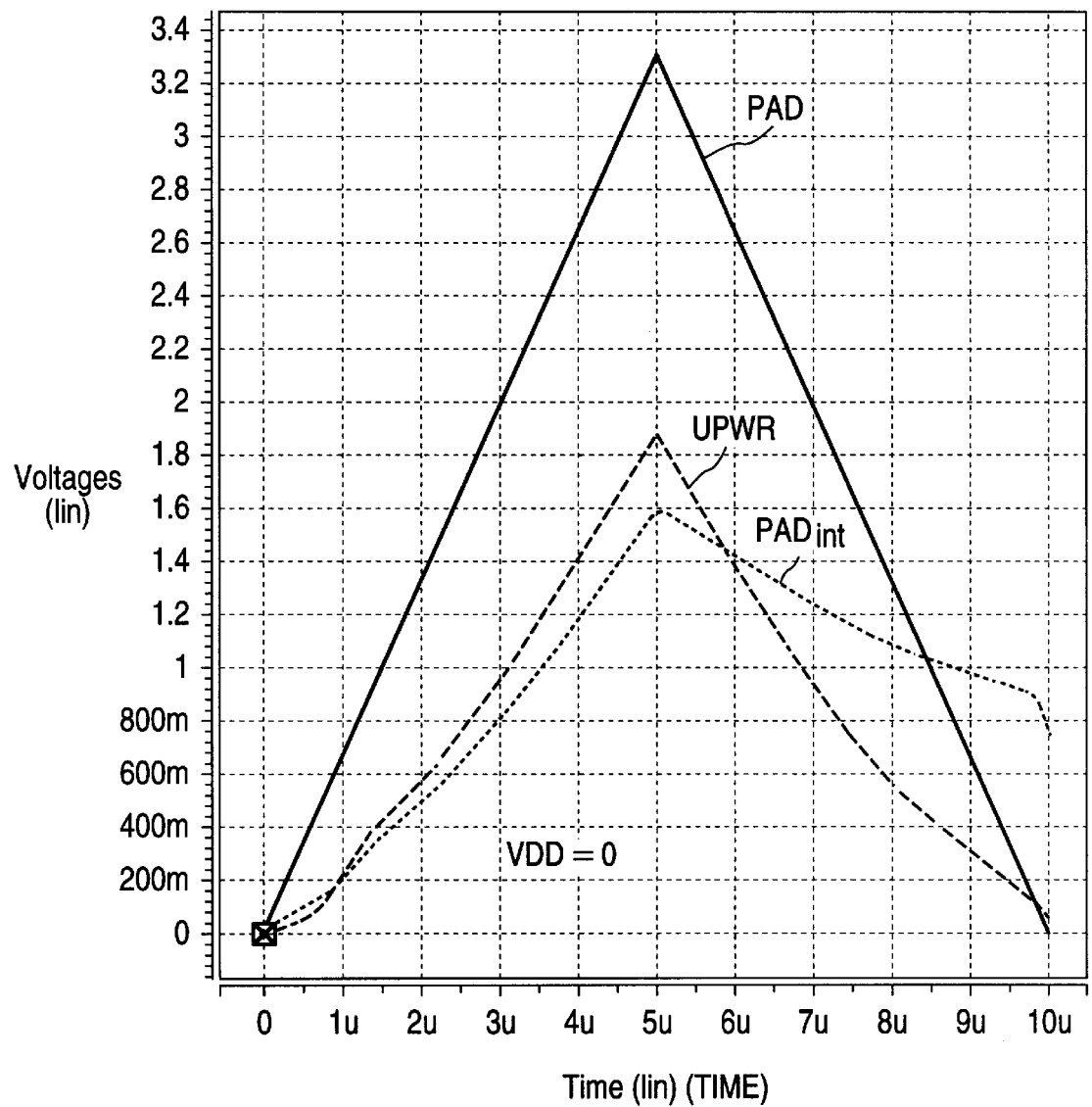
FIG. 7 shows the computer simulation results of the voltage levels of the two of the nodes of the input structure of FIG. 4 when the positive supply voltage is turned off and the voltage applied to the pad is ramped up and then ramped down.

FIG. 7 shows the computer simulation results of the voltage signals Vpwr and PADint when the voltage at pad 102 is ramped up from 0 to 3.3 volts and then ramped down form 3.3 volts to 0 volts and when supply voltage Vdd is at 0 volts. As seen from FIG. 7, signal Vpwr rises from 0 to 1.88 volts when the voltage at pad 102 increases from 0 to 3.3 volts. Similarly, when the voltage at pad 102 decreases from 3.3 to 0 volts, signal Vpwr also decreases from 1.88 volts to 0 volts.

Figure 8:
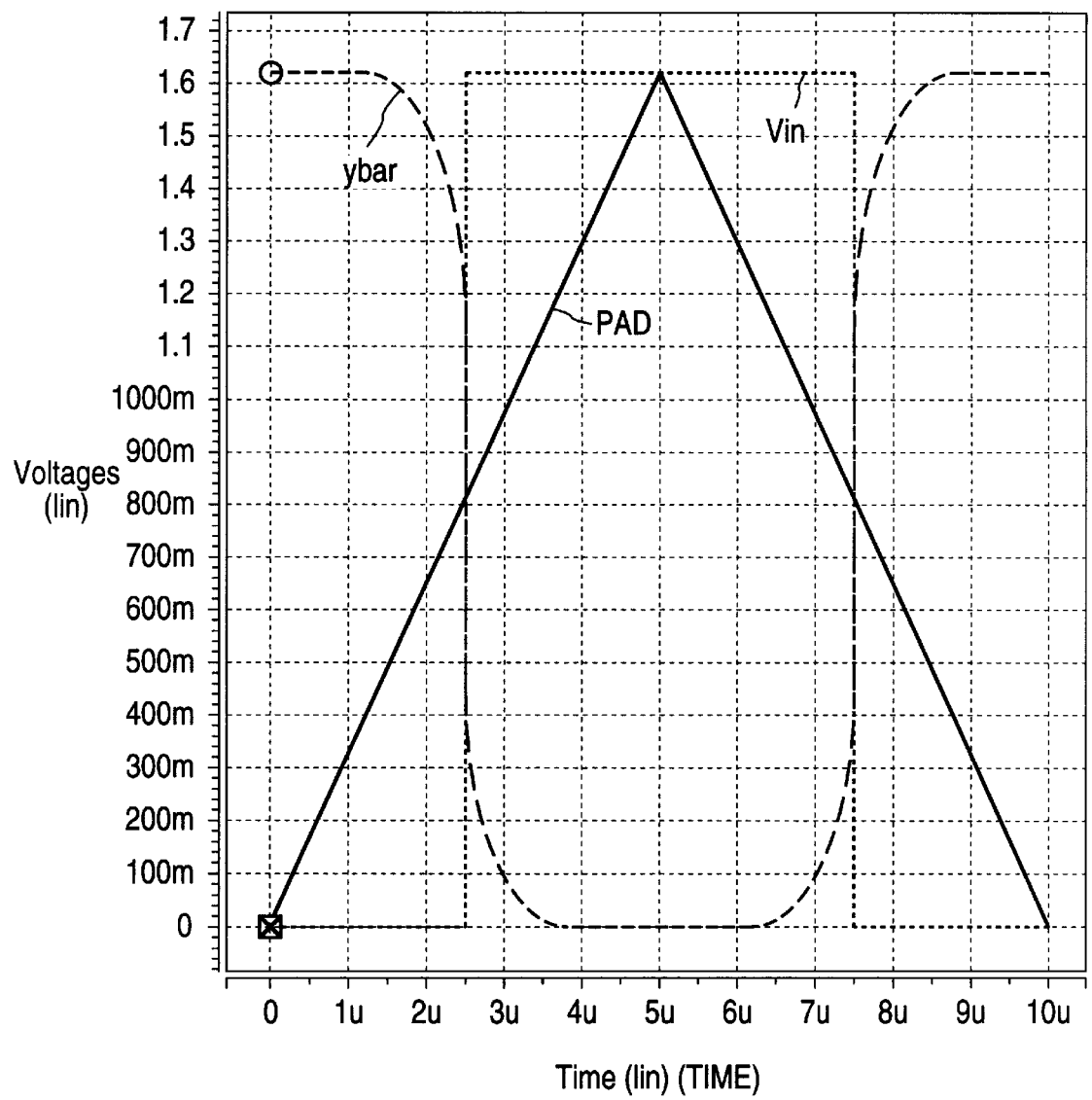
FIG. 8 shows the computer simulation results of the voltage level of the output signal of the input structure of FIG. 4 when the positive supply voltage is turned on and the voltage applied to the pad is ramped up and then ramped down.

FIG. 8 shows the computer simulation results of the voltage signal Vin when supply voltage Vdd is at 1.62 volts and when the voltage at pad 102 is ramped up from 0 to 1.62 volts and then ramped down form 1.62 volts to 0 volts. As seen from FIG. 8, during the ramp-up, signal Vin reaches 1.62 volts and then goes to 0 during the pad voltage ramp-down.

Figure 9:
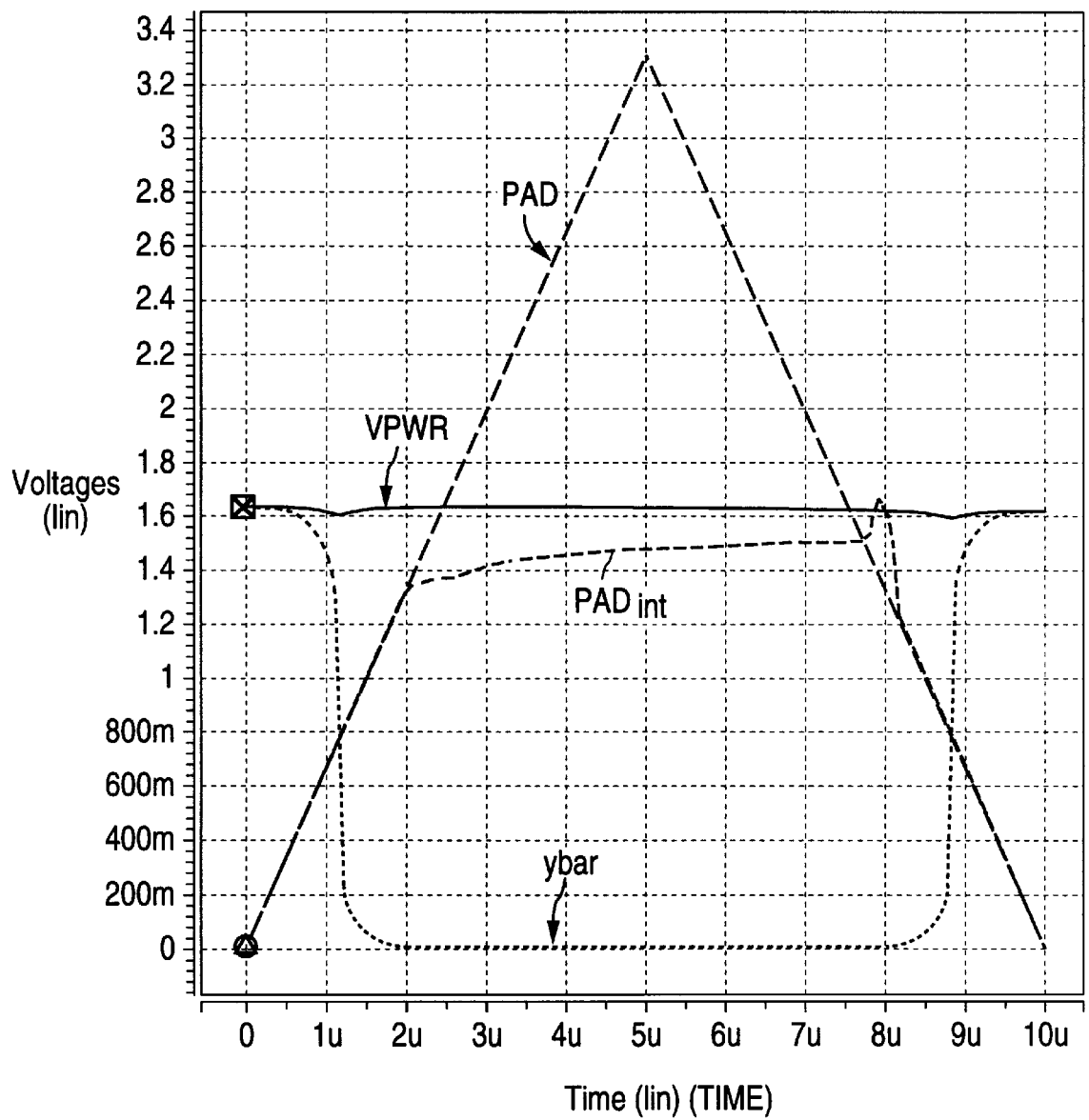
FIG. 9 shows the computer simulation results of the voltage levels at two of the nodes of the input structure of FIG. 4 when the positive supply voltage is turned on and the voltage applied to the pad is ramped up and then ramped down.

FIG. 9 shows the computer simulation results of the voltage signals Vpwr and PADint when supply voltage Vdd is at 1.62 volts and when the voltage at pad 102 is ramped up from 0 to 3.3 volts and then ramped down form 3.3 volts to 0 volts. As seen from FIG. 9, signal Vpwr remains at 1.62 volts (at the Vdd voltage) while voltage signal PADint increases during the ramp-up and decreases during the ramp-down.

It is understood from the above discussion that depending on the IC manufacturing process, the specified range of supply voltage Vdd and pad voltage 102, more or fewer transistors than that shown in transistor groups 220 and 240 may be required for proper operation of input structure 100.

Figure 10:
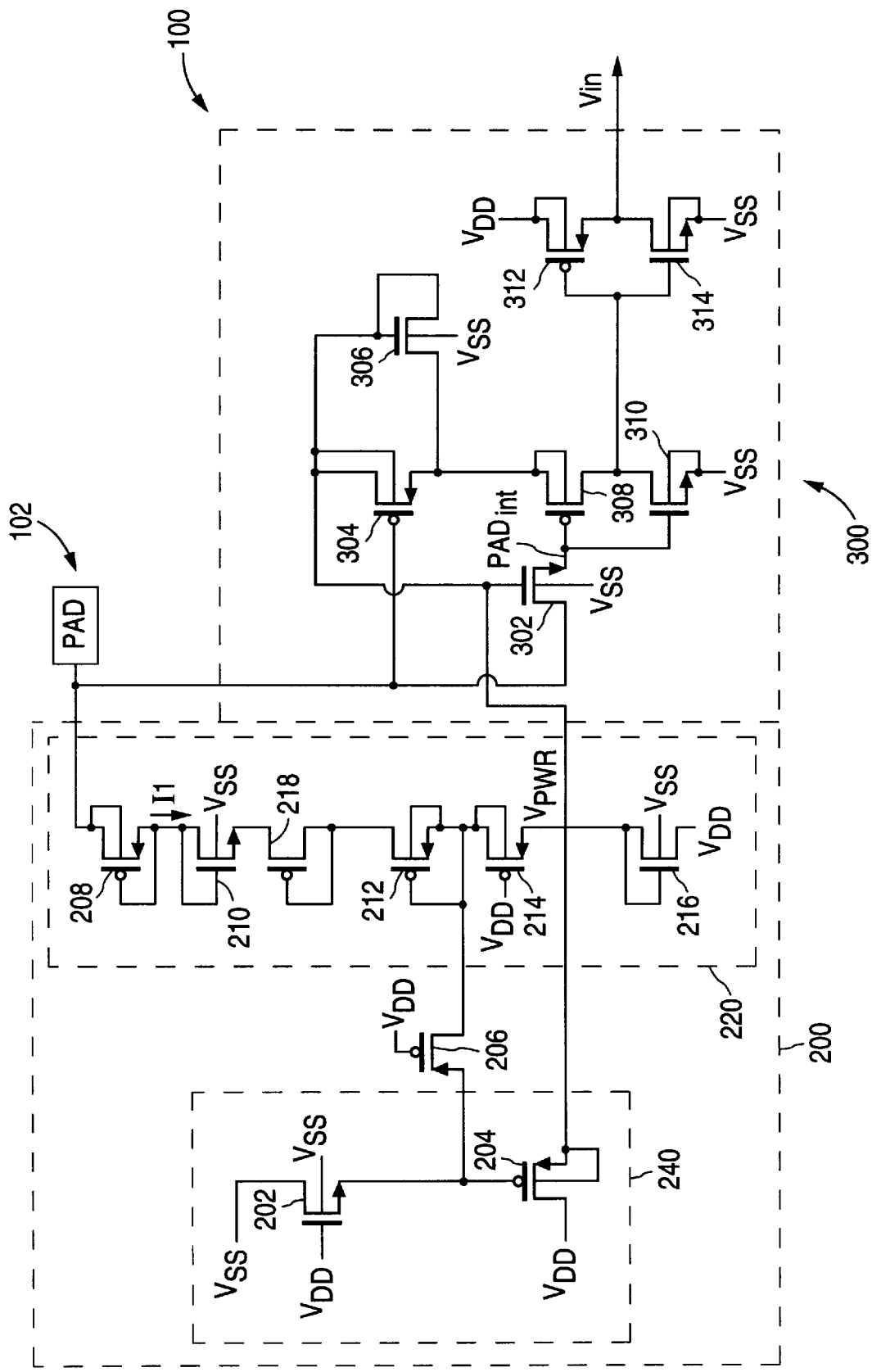
FIG. 10 shows a schematic diagram of the input structure, in accordance with another embodiment of the present invention.

FIG. 10 shows input structure 500, in accordance with another embodiment of the present invention. Identical reference numerals in FIGS. 4 and 10 refer to identical elements. Input structure 500 is similar to input structure 100 except that input structure 500 contains PMOS transistor 218, disposed between transistors 210 and 212. PMOS transistor 218 enables input structure 500 to operate with a wider range of pad 102 voltages. Accordingly, the range of allowable pad 102 voltages for input structure 500 is greater than that of input structure 100.

The exemplary embodiments of the invention disclosed above are illustrative and not limiting. The inventions is not limited by the number or type of transistors disposed in transistor group 220 of FIG. 4; nor is the invention limited by the number or type of transistors disposed in transistor group 240. For example, by varying the number of transistors in transistor group 220, the range of operable Vdd supply voltage for circuit 100 is varied. Other embodiments of this invention are possible within the scope of the appended claims.

I claim:

1. A circuit receiving a supply voltage from a power supply terminal, comprising:
   a voltage divider receiving an input voltage at an input terminal and providing a voltage at an output terminal when said supply voltage is above a predetermined value;
   a voltage transferor that transfers said supply voltage to said output terminal when said supply voltage is less than said predetermined value;
   a coupling transistor coupling said voltage divider to said voltage transferor such that, when said supply voltage is less than said predetermined value, said coupling transistor provides a control voltage from said voltage divider to disable said voltage transferor.

2. The circuit of claim 1 wherein the voltage divider comprises:
   a plurality of serially-connected diodes receiving said input voltage from said input terminal; and
   an MOS transistor receiving said supply voltage at a gate terminal and having current-carrying terminals connected to said diodes and said output terminal, said MOS transistor providing said voltage at said output terminal.

3. The circuit of claim 2 wherein the voltage transferor comprises first and second MOS transistors, said second MOS transistor having a gate terminal coupled to a first current carrying terminal of the first MOS transistor and having first and second current-carrying terminals connected respectively to receive said supply voltage and to provide said supply voltage to said output terminal when said second MOS transistor is conducting.

4. The circuit of claim 3 wherein the coupling transistor comprises an MOS transistor having current-carrying terminals connected respectively to an output terminal of said diodes and said gate terminal of said second MOS transistor of said voltage transferor.

5. The circuit of claim 4 wherein said input voltage is a pad voltage.

6. The circuit of claim 5 wherein the gate terminal of the first MOS transistor of the voltage transferor and the gate terminal of said coupling transistor both receive the supply voltage.

7. The circuit of claim 2 wherein the voltage divider further comprising a second MOS transistor having current-carrying terminals coupled to said output terminal and said power supply terminal.

8. The circuit of claim 3 wherein the first MOS transistor of the voltage transferor receives a second supply voltage.

9. The circuit of claim 1 further comprising a buffer, said buffer comprising:
   a first MOS transistor having (a) a gate terminal connected to said output terminal and (b) a first current-carrying terminal connected to said input terminal;
   a second MOS transistor having (a) a gate terminal connected to said input terminal and (b) a first current-carrying terminal connected to said output terminal;
   a diode connected between said output terminal and a second current-carrying terminal of sid second MOS transistor of said buffer;
   a third MOS transistor having (a) a gate terminal connected to a second current-carrying terminal of the first MOS transistor of the buffer and (b) a first current-carrying terminal connected to the second current-carrying terminal of the second MOS transistor of the buffer; and
   a fourth MOS transistor having (a) a gate terminal that is connected to the gate terminal of the fourth MOS transistor of the buffer, (b) a first current-carrying terminal connected to a second current carrying terminal of the third MOS transistor and (c) a second-current carrying terminal for receiving a second supply voltage.

* * * * *